US010424228B2

(12) United States Patent
Zhou et al.

(10) Patent No.: US 10,424,228 B2
(45) Date of Patent: Sep. 24, 2019

(54) ARRAY SUBSTRATE HAVING DIFFERENT DISPLAY AREAS, ELECTRONIC PAPER DISPLAY PANEL AND DRIVING METHOD THEREOF

(71) Applicant: Shanghai Tianma Micro-Electronics Co., Ltd., Shanghai (CN)

(72) Inventors: Yian Zhou, Shanghai (CN); Kerui Xi, Shanghai (CN)

(73) Assignee: Shanghai Tianma Micro-Electronics Co., Ltd., Shanghai (CN)

(*) Notice: Subject to any disclaimer, the term of this patent is extended or adjusted under 35 U.S.C. 154(b) by 5 days.

(21) Appl. No.: 15/794,689

(22) Filed: Oct. 26, 2017

(65) Prior Publication Data

US 2018/0047316 A1 Feb. 15, 2018

(30) Foreign Application Priority Data

Jun. 30, 2017 (CN) .......................... 2017 1 0523817

(51) Int. Cl.
  *G09F 9/30* (2006.01)
  *G09G 3/20* (2006.01)
  (Continued)

(52) U.S. Cl.
  CPC ........... *G09F 9/301* (2013.01); *G09G 3/2092* (2013.01); *G09G 3/344* (2013.01); *H01L 27/14609* (2013.01); *G09G 2300/0408* (2013.01); *G09G 2300/0426* (2013.01); *G09G 2310/0237* (2013.01); *G09G 2310/0243* (2013.01); *G09G 2310/0248* (2013.01); *G09G 2310/0264* (2013.01); *G09G 2310/0297* (2013.01); *G09G 2380/14* (2013.01)

(58) Field of Classification Search
  CPC ....................................................... G09F 9/301
  USPC ....................................................... 345/204
  See application file for complete search history.

(56) References Cited

U.S. PATENT DOCUMENTS

2005/0281127 A1* 12/2005 Okuno ................. G09G 3/3685
                                                                365/233.15
2006/0007768 A1* 1/2006 Kim ..................... G09G 3/3291
                                                                365/205

(Continued)

FOREIGN PATENT DOCUMENTS

CN        106057855 A    10/2016
CN        205656814 U    10/2016

*Primary Examiner* — Long D Pham
(74) *Attorney, Agent, or Firm* — Anova Law Group, PLLC

(57) ABSTRACT

An array substrate, an electronic paper display panel and a driving method are provided. The array substrate includes at least two display areas provided with a plurality of data signal lines, and a peripheral circuit area provided with a plurality of signal leads, a plurality of switch modules and surrounding the at least two display areas. Each one data signal line is electrically connected to one signal lead through one switch module. Further, the array substrate includes at least two control signal lines provided in the peripheral circuit area. All control terminals of the switch modules corresponding to all the data signal lines in single one display area are electrically connected to the same one control signal line, and the control terminals of the switch modules corresponding to the data signal lines in different display areas are electrically connected to different control signal lines.

18 Claims, 14 Drawing Sheets

(51) Int. Cl.
*H01L 27/146* (2006.01)
*G09G 3/34* (2006.01)

(56) References Cited

U.S. PATENT DOCUMENTS

| 2014/0002331 A1* | 1/2014 | Yoo | G09G 3/3208 |
| | | | 345/76 |
| 2016/0004372 A1* | 1/2016 | Nakajima | G06F 3/044 |
| | | | 345/174 |
| 2017/0324154 A1* | 11/2017 | Hendrix | H01Q 1/1228 |

* cited by examiner

ARRAY SUBSTRATE HAVING DIFFERENT DISPLAY AREAS, ELECTRONIC PAPER DISPLAY PANEL AND DRIVING METHOD THEREOF

CROSS-REFERENCES TO RELATED APPLICATIONS

This application claims the priority of Chinese patent application No. 201710523817.0, filed on Jun. 30, 2017, the entirety of which is incorporated herein by reference.

FIELD OF THE DISCLOSURE

The present disclosure generally relates to the field of display technology and, more particularly, relates to an array substrate, electronic paper display panel and driving method thereof.

BACKGROUND

Electronic paper display is a flat panel display technology having the display performance similar to that of paper. An electronic paper display panel has a huge application space in the fields of e-reader (e-book), electronic price card, industrial instrumentation, dynamic display billboard, and media products, etc.

FIG. 1 illustrates a conventional electronic paper display panel. Referring to FIG. 1, the electronic paper display panel 100 includes a plurality of data signal lines 200. Because the electronic paper display panel is long, to charge the plurality of data signal lines during the display process, four or more driving chips and four or more flexible circuit boards are needed to provide driving signals for the data signal lines. The number of the needed driving chips is relatively large. For example, the electronic paper display product having a length of more than 1.5 meters, such as a sign and a billboard, often needs 10 driving chips and, thus, the cost is high. The disclosed device structures and methods are directed to solve one or more problems set forth above and other problems.

BRIEF SUMMARY OF THE DISCLOSURE

One aspect of the present disclosure includes an array substrate. The array substrate includes at least two display areas, and a peripheral circuit area surrounding the at least two display areas. The array substrate also includes a plurality of data signal lines provided in each display area, and a plurality of signal leads provided in the peripheral circuit area. In addition, the array substrate includes a plurality of switch modules provided in the peripheral circuit area. Each one data signal line is electrically connected to one signal lead through one switch module. A first terminal of the switch module is electrically connected to the data signal line, and a second terminal of the switch module is electrically connected to the signal lead. Further, the array substrate includes at least two control signal lines provided in the peripheral circuit area. All control terminals of the switch modules corresponding to all the data signal lines in single one display area are electrically connected to the same control signal line, and the control terminals of the switch modules corresponding to the data signal lines in different display areas are electrically connected to different control signal lines.

Another aspect of the present disclosure includes an electronic paper display panel. The electronic paper display panel includes an array substrate. The array substrate includes at least two display areas, and a peripheral circuit area surrounding the at least two display areas. The array substrate also includes a plurality of data signal lines provided in each display area, and a plurality of signal leads provided in the peripheral circuit area. In addition, the array substrate includes a plurality of switch modules provided in the peripheral circuit area. Each one data signal line is electrically connected to one signal lead through one switch module. A first terminal of the switch module is electrically connected to the data signal line, and a second terminal of the switch module is electrically connected to the signal lead. Further, the array substrate includes at least two control signal lines provided in the peripheral circuit area. All control terminals of the switch modules corresponding to all the data signal lines in single one display area are electrically connected to the same control signal line, and the control terminals of the switch modules corresponding to the data signal lines in different display areas are electrically connected to different control signal lines.

Another aspect of the present disclosure includes a driving method of an electronic paper display panel. The electronic paper display panel includes an array substrate. The array substrate includes at least two display areas, and a peripheral circuit area surrounding the at least two display areas. The array substrate also includes a plurality of data signal lines provided in each display area, and a plurality of signal leads provided in the peripheral circuit area. In addition, the array substrate includes a plurality of switch modules provided in the peripheral circuit area. Each one data signal line is electrically connected to one signal lead through one switch module. A first terminal of the switch module is electrically connected to the data signal line, and a second terminal of the switch module is electrically connected to the signal lead. Further, the array substrate includes at least two control signal lines provided in the peripheral circuit area. All control terminals of the switch modules corresponding to all the data signal lines in single one display area are electrically connected to the same control signal line, and the control terminals of the switch modules corresponding to the data signal lines in different display areas are electrically connected to different control signal lines. The driving method includes controlling all the switch modules corresponding to at least one display area to be turned on and all the switch modules corresponding to the other display areas to be turned off, at the same time, through the at least two control signal lines. The driving method also includes charging all the data signal lines electrically connecting to the turned-on switch modules through the signal leads. In addition, the driving method includes controlling all the switch modules corresponding to another display area to be turned on and all the switch modules corresponding to the other display areas to be turned off, at the same time, through the at least two control signal lines. Further, the driving method includes charging all the data signal lines electrically connecting to the turned-on switch modules through the signal leads.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
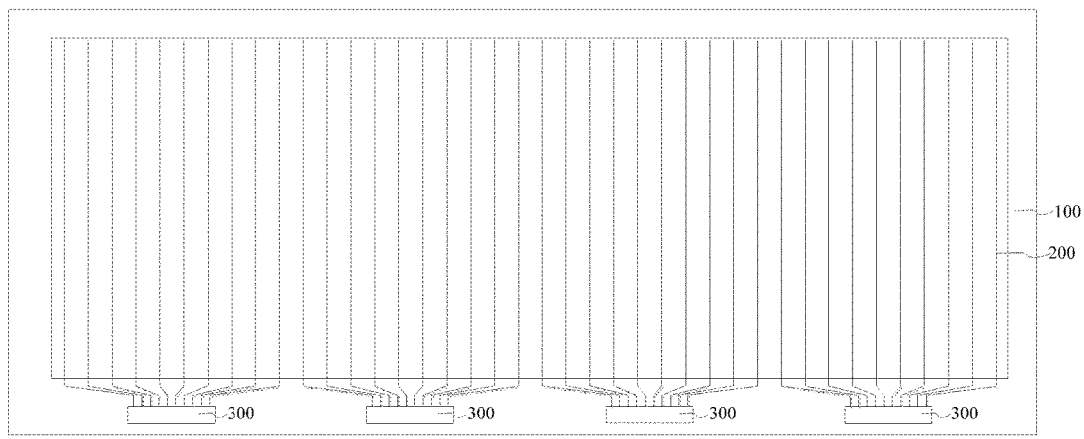
FIG. 1 illustrates a conventional electronic paper display panel.
Figure 2:
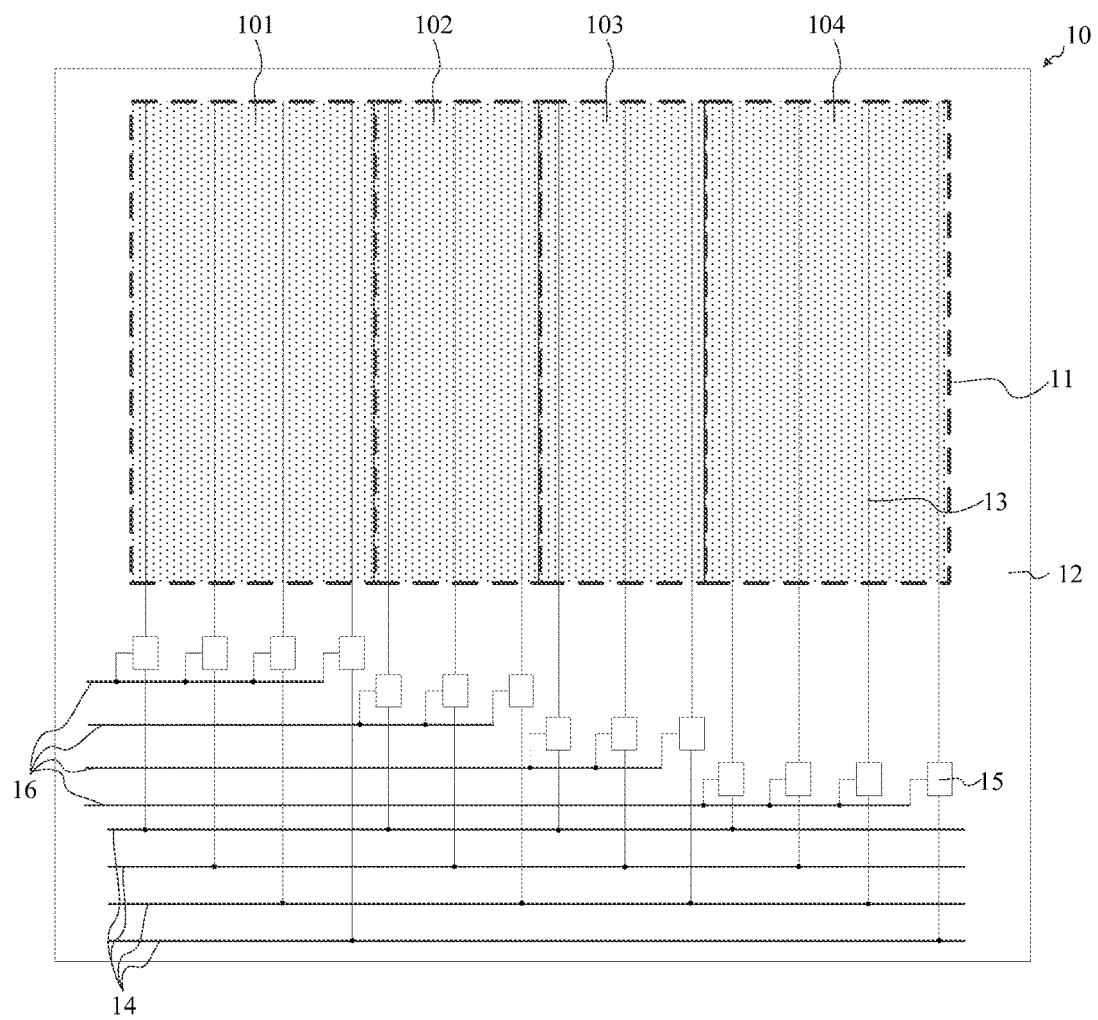
FIG. 2A illustrates an array substrate consistent with various disclosed embodiments of the present disclosure.
FIG. 2B illustrates another array substrate consistent with various disclosed embodiments of the present disclosure.
FIG. 2C illustrates another array substrate consistent with various disclosed embodiments of the present disclosure.

FIG. 2A illustrates an array substrate consistent with disclosed embodiments. Referring to FIG. 2A, the array substrate 10 may include at least two display areas and a peripheral circuit area 12 surrounding the at least two display areas. FIG. 2A illustrates four display areas as an example, including a first display area 101, a second display area 102, a third display area 103, and a fourth display area 104.

Each display area may be provided with a plurality of data signal lines 13. The peripheral circuit area 12 may be provided with a plurality of signal leads 14 and a plurality of switch modules 15. Each one data signal line 13 may be electrically connected to one signal lead 14 through one switch module 15. A first terminal of the switch module 15 may be electrically connected to the data signal line 13, and a second terminal of the switch module 15 may be electrically connected to the signal lead 14.

The number of the data signal lines 13 in each display area may be less than or equal to the number of the signal leads 14. For the display area where the number of the data signal lines 13 is less than the number of the signal leads 14, portions of the plurality of signal leads 14 may be one to one electrically connected to the data signal lines 13 in the display area. For the display area where the number of the data signal lines 13 is equal to the number of the signal leads 14, the plurality of signal leads 14 may be one to one electrically connected to the data signal lines 13 in the display area. For example, the number of the data signal lines 13 in both the first display area 101 and the fourth display area 104 may be equal to the number of the signal leads 14, which may be four. The four data signal lines 13 in the first display area 101 may be one to one electrically connected to the four signal leads 14. The four data signal lines 13 in the fourth display area 104 may be one to one electrically connected to the four signal leads 14. The number of the data signal lines 13 in both the second display area 102 and the third display area 103 may be less than the number of the signal leads 14. The three data signal lines 13 in the second display area 102 may be one to one electrically connected to three of the four signal leads 14. The three data signal lines 13 in the third display area 103 may be one to one electrically connected to three of the four signal leads 14. Other number of data signal lines or signal leads may also be used.

The peripheral circuit area 12 may also be provided with at least two control signal lines 16. All the control terminals of the switch modules 15 corresponding to all the data signal lines 13 in each one display area may be electrically connected to the same control signal line 16. The control terminals of the switch modules 15 corresponding to the data signal lines 13 in different display areas may be electrically connected to different control signal lines 16. In other words, the number of the control signal lines 16 may be equal to the number of the display areas. Each control terminal of all the switch modules 15 electrically connecting to the data signal lines 13 in each one display area may be electrically connected to the same control signal line 16.

The number of the display areas on the array substrate 10 and the number of the data signal lines 13 in each display area can be configured according to the specific array substrate. For the display area where the number of the data signal lines 13 is less than the number of the signal leads 14, portions of the signal leads 14 may not output data signals when charging the data signal lines 13 in the display area.

For example, when the first display area 101 needs to be controlled to display data, control signals may be outputted to the control signal lines 16. For example, a driving integrated circuit (IC) may output the control signals to the control signal lines 16 to control the switch modules 15 electrically connecting to the data signal lines 13 in the first display area 101 to be turned on, and, at the same time, to control the switch modules 15 electrically connecting to the data signal lines 13 in the second display area 102, the third display area 103 as well as the fourth display area 104 to be turned off. The data signals on the signal leads 14 may be transmitted to the data signal lines 13 in the first display area 101. In other words, the data signal lines 13 in the first display area 101 may be charged.

A data driving circuit (also known as a source driving circuit) may provide the data signals to the signal leads 14. When the second display area 102 needs to be controlled to display, the control signals may be outputted to the control signal lines 16 to control the switch modules 15 electrically connecting to the data signal lines 13 in the second display area 102 to be turned on, and, at the same time, to control the switch modules 15 electrically connecting to the data signal lines 13 in the first display area 101, the third display area 103 as well as the fourth display area 104 to be turned off. The data signals on the signal leads 14 may be transmitted to the data signal lines 13 in the second display area 102. In other words, the data signal lines 13 in the second display area 102 may be charged.

Therefore, a separate control for each display area may be realized. When a screen needs to be displayed on all the display areas, the data signal lines in the respective display areas may be charged on an area-by-area basis. Then the screen may be displayed on all the display areas of the display panel formed on the array substrate.

The array substrate in the present disclosure may be provided with at least two display areas. The data signal lines 13 in each display area may be electrically connected to the signal leads 14 through the switch modules 15. The data signals can be transmitted to the data signal lines 13 in each display area by controlling the switch modules 15. In other words, the charging display of the data signal lines 13 in each display area may be realized. The data signals may be generally provided by the data driving circuit. The number of data signal output terminals of the data driving circuit may only need to be equal to the number of the signal leads 14 to realize the charging display of all the data signal lines 13 on the array substrate. The number of the signal leads 14 may be much smaller than the number of the data signal lines 13. Therefore, the number of the data signal output terminals of the data driving circuit on the array substrate may also be much smaller than the number of the data signal lines 13.

In the conventional array substrate, the number of the data signal output terminals of the data driving circuit on the array substrate may be generally equal to the number of all the data signal lines 13 to realize the charging display of the data signal lines on the array substrate. The array substrate in the present disclosure may save the data signal output terminals and the cost. When the data driving circuit uses the driving integrated circuit (IC) and a flexible circuit board (FPC), only a small amount of or even only one IC and FPC may be needed to drive a plurality of display areas to display, and then to drive all the display areas to display. Compared to the plurality of IC and FPC on the conventional array substrate, the number of IC and FPC may be saved, and the cost may be saved.

Figure 2B:
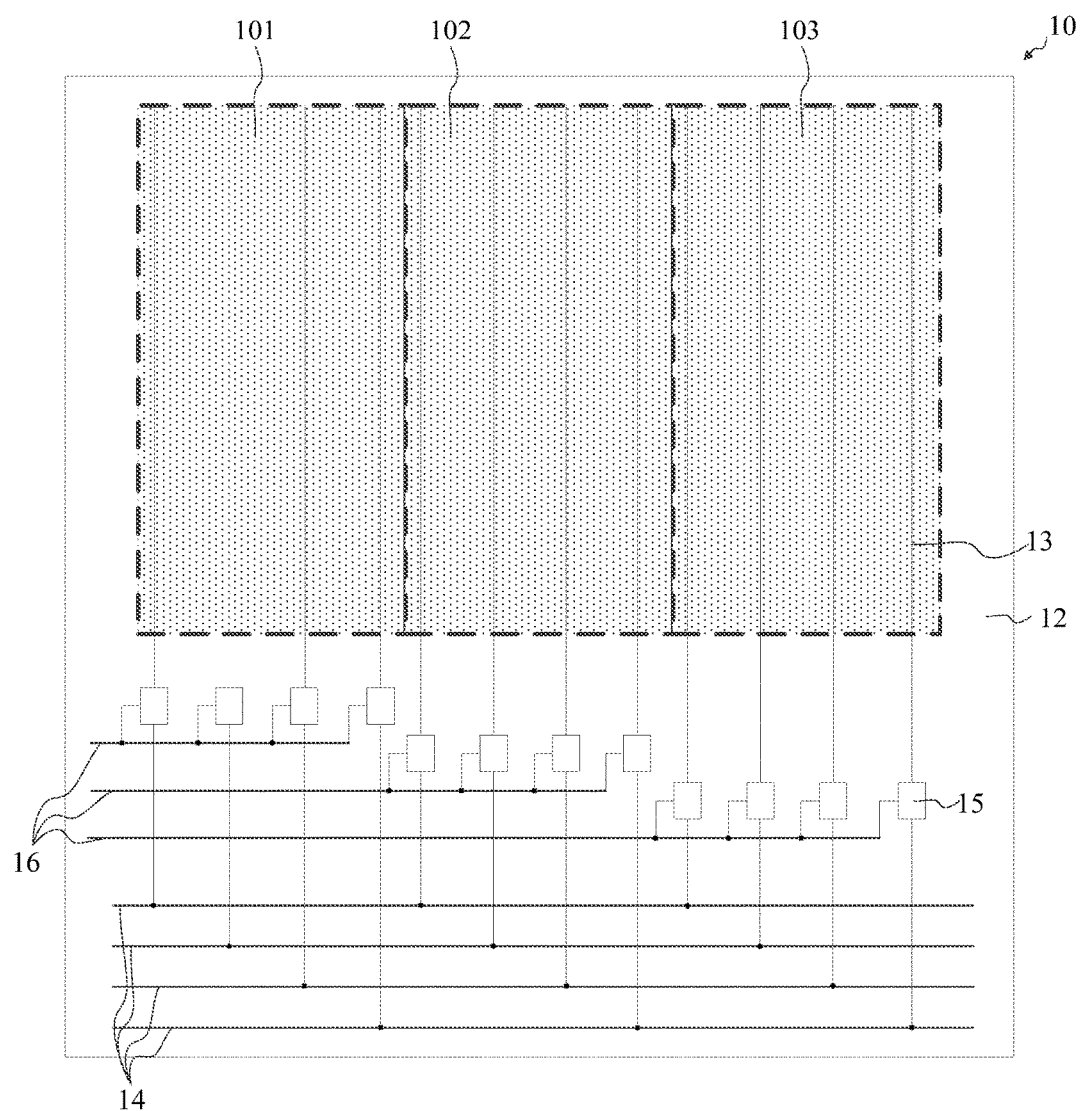

FIG. 2B illustrates another array substrate consistent with disclosed embodiments. FIG. 2B illustrates three display areas as an example, including the first display area 101, the second display area 102, and the third display area 103. The number of the data signal lines 13 in each display area may be the same. Each one signal lead 14 may be electrically connected to one data signal line 13 in each display area, respectively. In other words, the plurality of signal leads 14 may be one to one electrically connected to the data signal lines 13 in the first display area 101. The plurality of signal leads 14 may be one to one electrically connected to the data signal lines 13 in the second display area 102. The plurality of signal leads 14 may be one to one electrically connected to the data signal lines 13 in the third display area 103. When performing the charging display on each display area, the plurality of signal leads 14 may output the data signals to improve the use efficiency of the signal leads 14. Other number of display areas, signal lines, and signal leads may be used.

In the present disclosure, the array substrate may include three or four display areas. Since the signal leads need to be electrically connected to the data signal lines 13 in each display area, portions of the data signal lines 13 electrically connecting to the signal leads 14 may need to be overlapped with the signal leads 14, and may generally be provided in different film layers. When the size of the array substrate is fixed and the number of display areas divided on the array substrate is large, a large number of film layers may need to be provided. Thus, the number of MASK (mask plates) required in the production process may be large. Generally, the array substrate may include three or four display areas, thus, the number of MASK may be saved, and the production cost may be reduced.

Figure 2C:
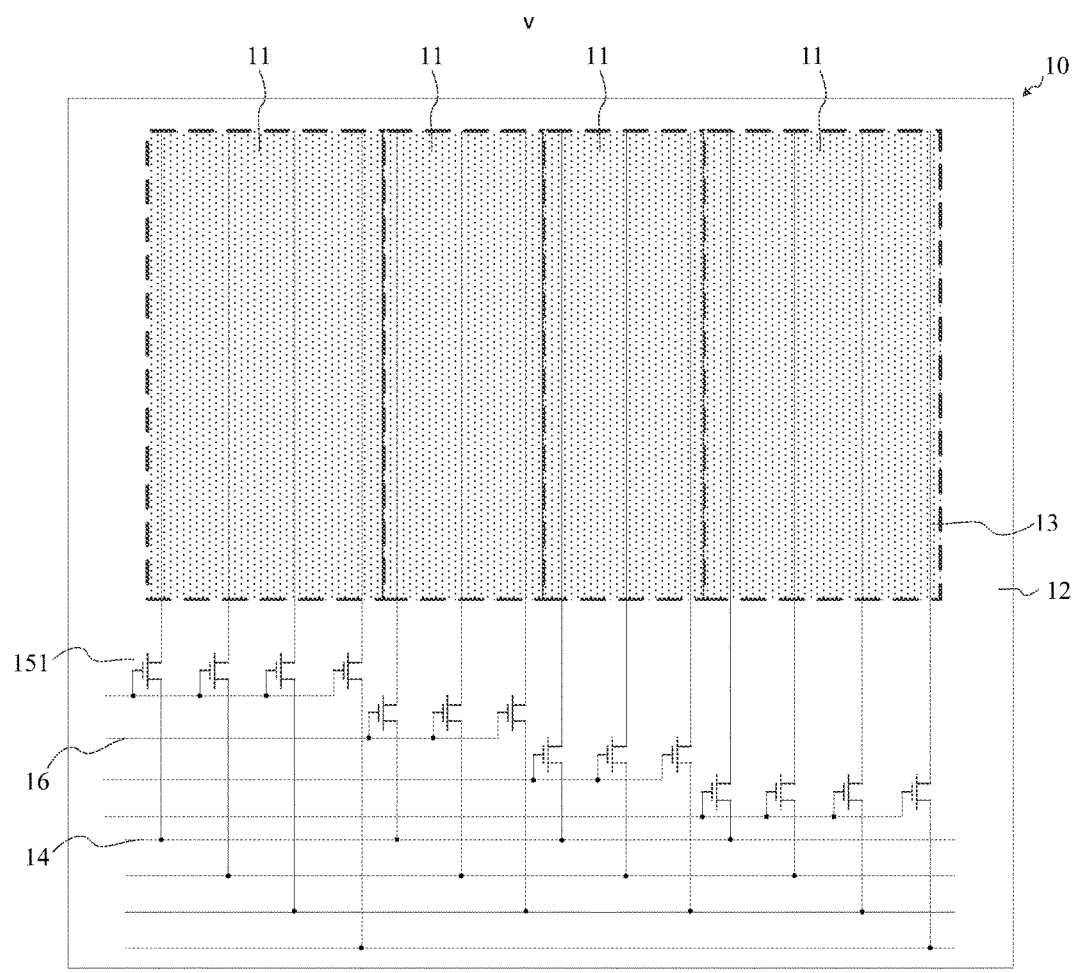

FIG. 2C illustrates another array substrate consistent with disclosed embodiments. Referring to FIG. 2C, on the basis of the above embodiments, each switch module in the array substrate may include a transistor 151. A first terminal of the transistor 151 may be electrically connected to the first terminal of the switch module. In other words, the first terminal of the transistor 151 may be electrically connected to the data signal line 13 in the display area 11. A second terminal of the transistor 151 may be electrically connected to the second terminal of the switch module. In other words, the second terminal of the transistor 151 may be electrically connected to the signal lead 14. A gate of the transistor 151 may be electrically connected to the control terminal of the switch module. In other words, the gate of the transistor 151 may be electrically connected to the control signal line 16. The transistor 151 may be controlled to be turned on or off by outputting a control signal to the control signal line 16. Therefore, the data signal on the signal lead 14 may be transmitted to the data signal line 13 in the corresponding display area 11, and the charge of the data signal line 13 may be realized.

Figure 3:
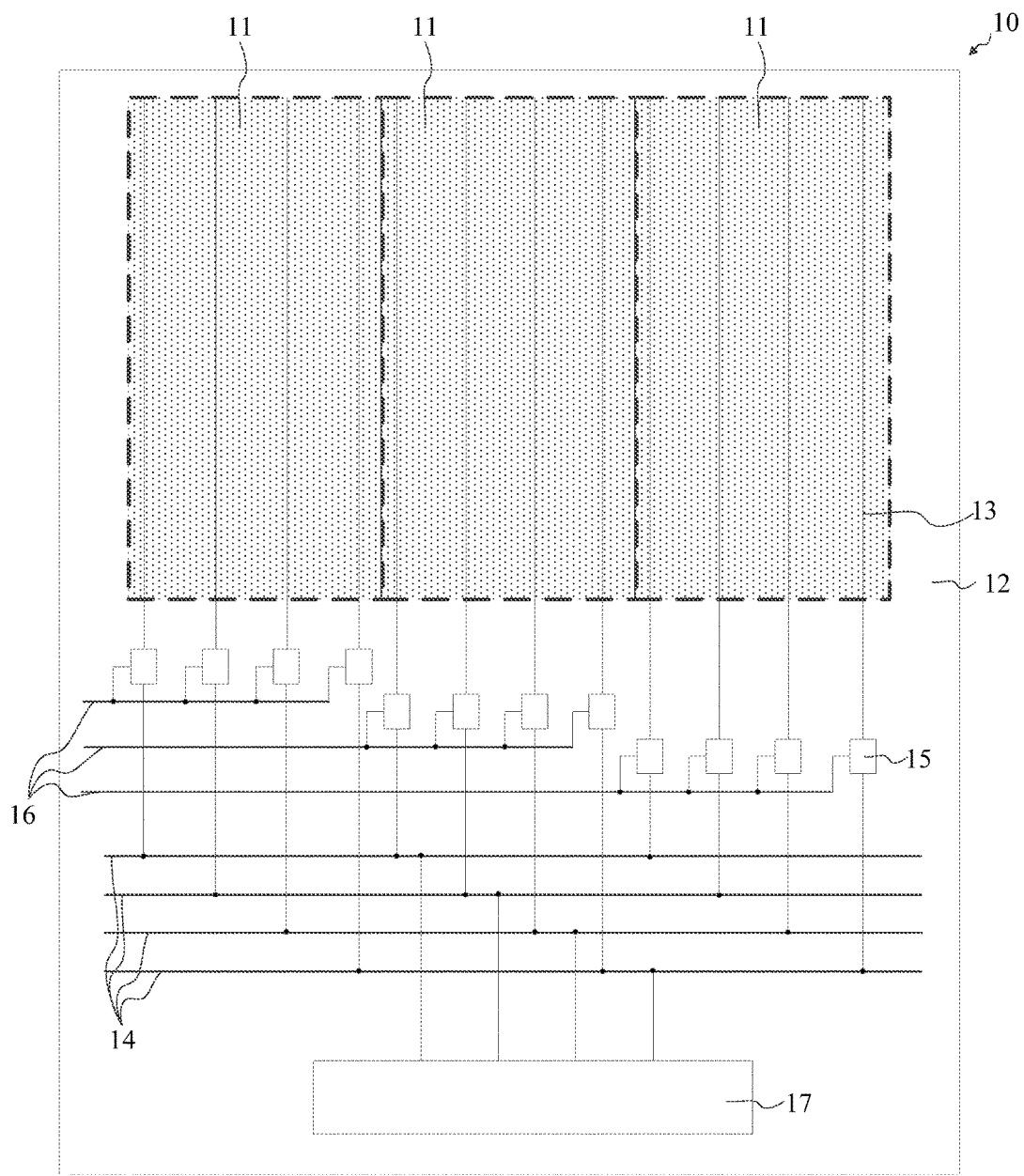
FIG. 3A illustrates another array substrate consistent with various disclosed embodiments of the present disclosure.
FIG. 3B illustrates another array substrate consistent with various disclosed embodiments of the present disclosure.
Figure 3:
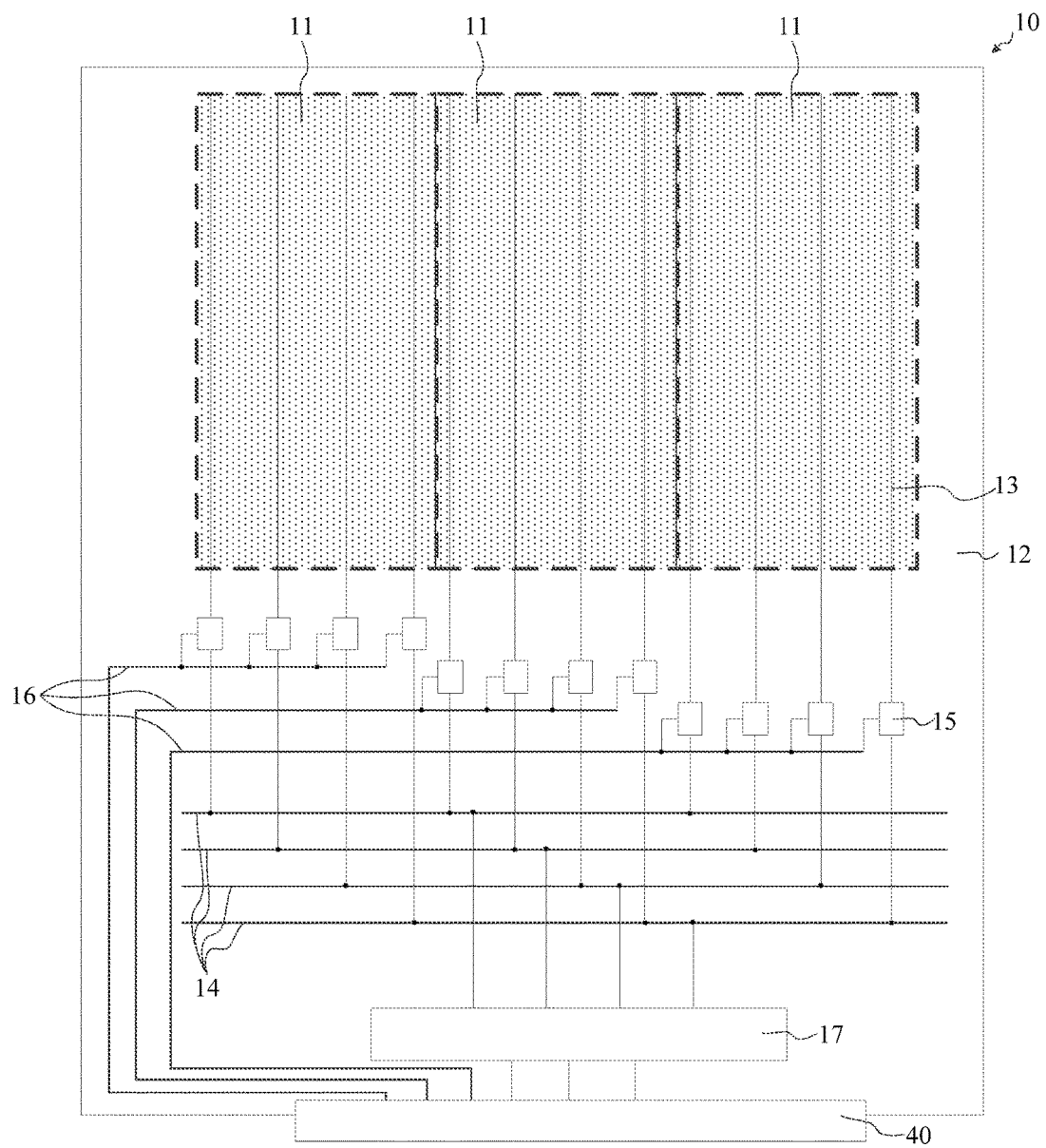

FIG. 3A illustrates another array substrate consistent with disclosed embodiments. Referring to FIG. 3A, on the basis of the above embodiments, the peripheral circuit area 12 of the display panel may be provided with a data driving circuit 17. The data signal output terminals of the data driving circuit 17 may be one to one electrically connected to the signal leads 14. The data driving circuit 17 may output the data signals to the signal leads 14. The data driving circuit 17 may employ a data driving integrated circuit (data driving IC).

Optionally, in the present disclosure, referring to FIG. 3A, the control signal lines 16 may be electrically connected to the control signal output terminals of the data driving circuit 17. The control signals may be provided from the data driving circuit 17, and may be transmitted to the control terminals of the switch modules 15 through the control signal lines 16, to control the switch modules 15 to be turned on or off.

Optionally, referring to FIG. 3B, after forming the display panel on the array substrate 10, a flexible circuit board 40 may also be provided on the array substrate 10. The data driving circuit 17 may be electrically connected to the flexible circuit board 40, and the control signal lines 16 on the array substrate 10 may be electrically connected to the flexible circuit board 40. The control signals may be provided from the flexible circuit board 40, and may be transmitted to the control terminals of the switch modules 15 through the control signal lines 16, to control the switch modules 15 to be turned on or off.

Figure 4:
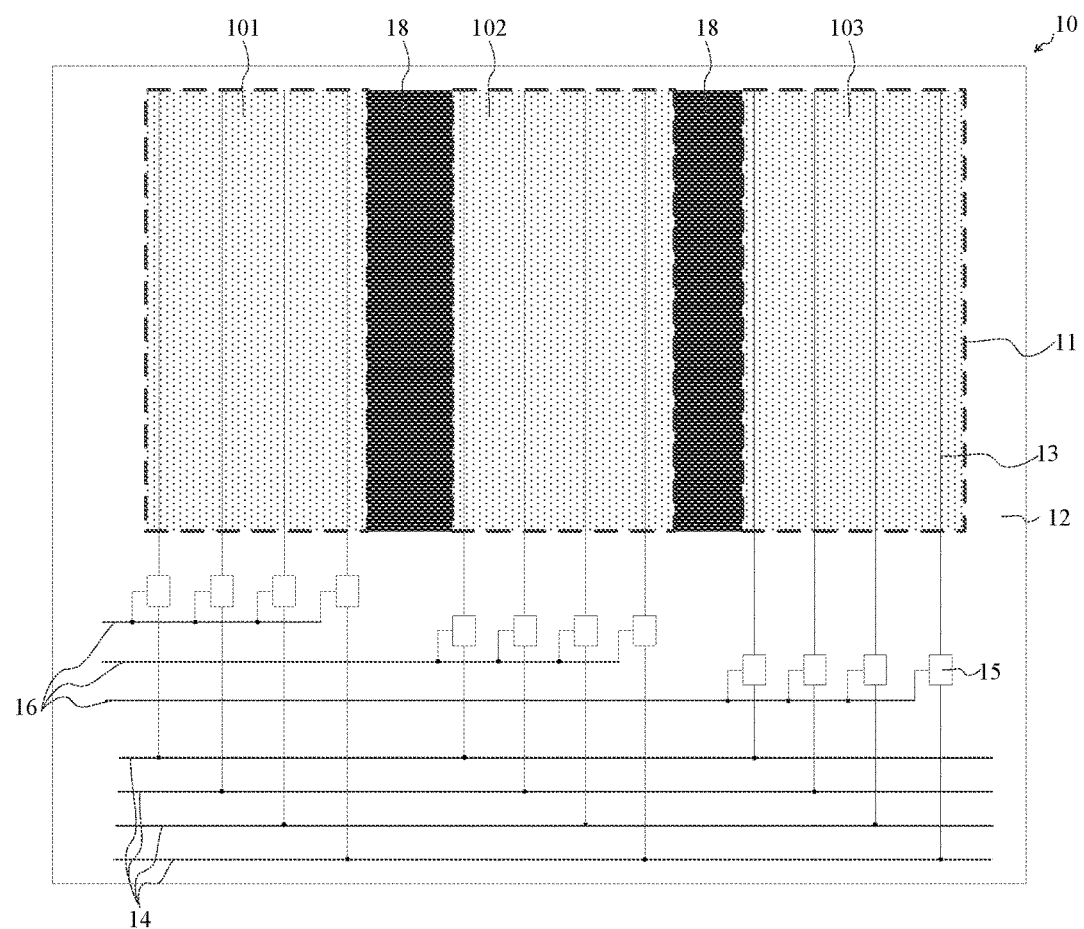
FIG. 4 illustrates another array substrate consistent with various disclosed embodiments of the present disclosure.

FIG. 4 illustrates another array substrate consistent with disclosed embodiments. Referring to FIG. 4, in contract to the array substrate shown in FIG. 2B, the array substrate may also include at least one boundary area 18 between the adjacent display areas. For example, the boundary area 18 may be located between the first display area 101 and the second display area 102. The boundary area 18 may not be used for display, and may be used to divide the adjacent two display areas. In one embodiment, further, the array substrate 10 may include a common electrode and arrayed pixel electrodes. The common electrode and the pixel electrodes may be disposed in the display areas. One data signal line 13 may be electrically connected to one column of pixel electrodes through a thin film transistor (TFT). The boundary area 18 may not be simultaneously provided with the pixel electrodes and the common electrode, and the boundary area 18 may not be used for display.

In one embodiment, the array substrate 10 may include a plurality of boundary areas. The boundary areas may be located between any two adjacent display areas. Referring to FIG. 4, for example, the boundary areas 18 may be provided between the first display area 101 and the second display area 102 as well as between the second display area 102 and the third display area 103.

Figure 5A:
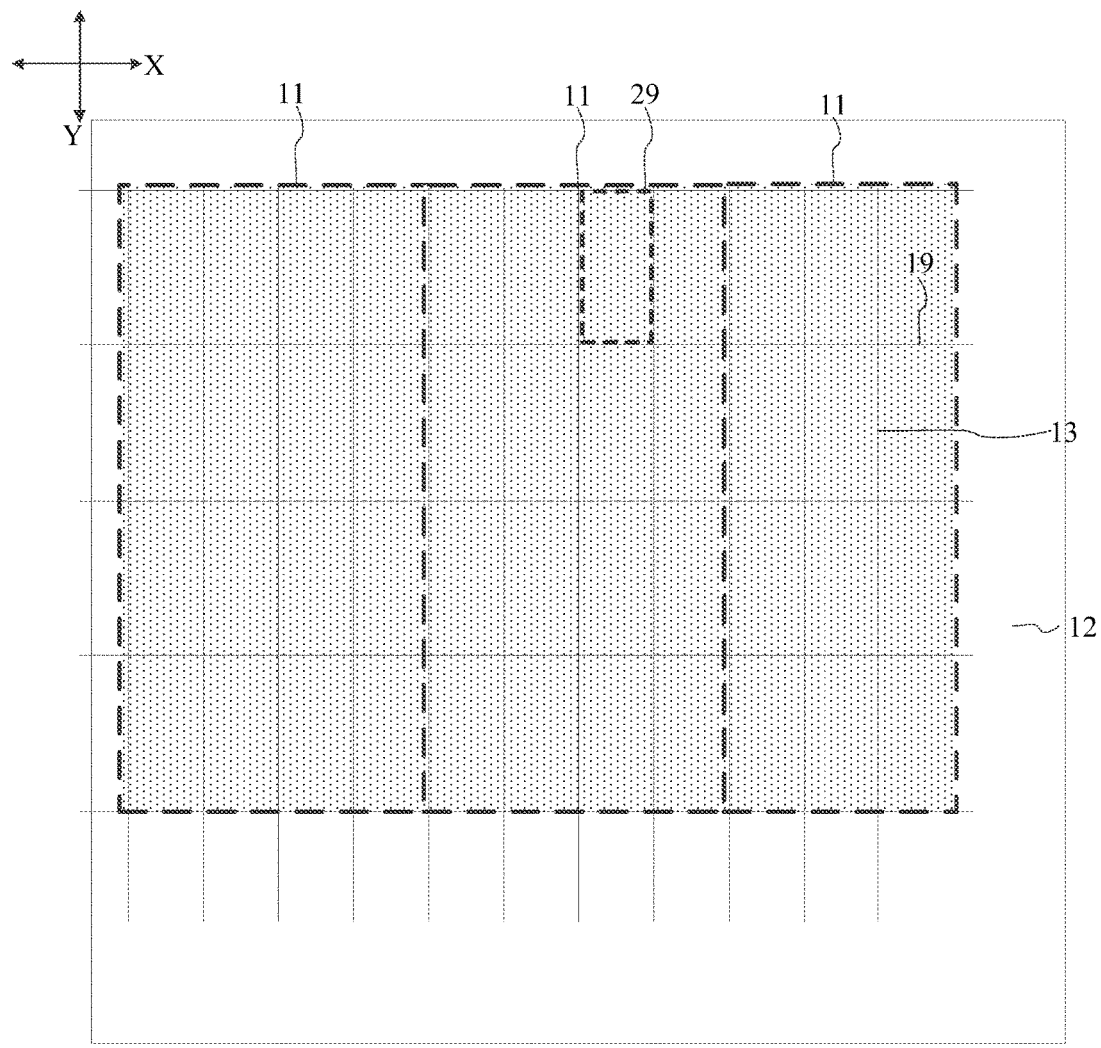
FIG. 5A illustrates a top view of a display panel consistent with various disclosed embodiments of the present disclosure.
Figure 5B:
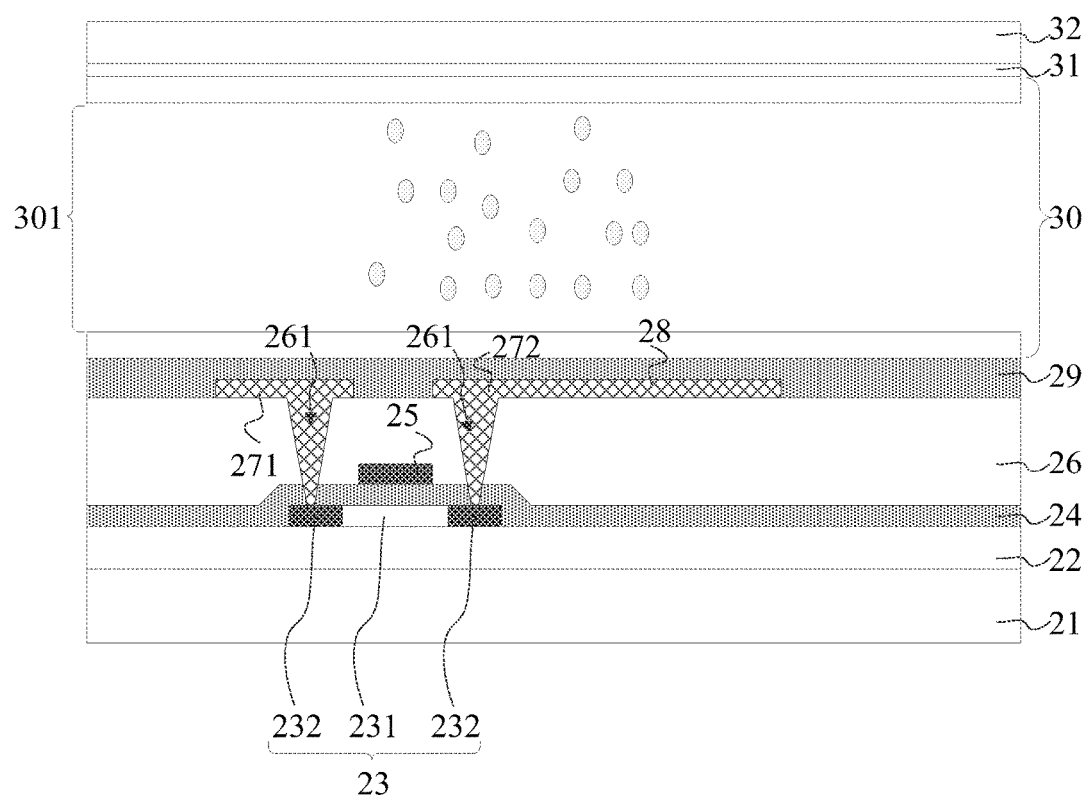
FIG. 5B illustrates a cross-sectional view of a display panel consistent with various disclosed embodiments of the present disclosure.

The present disclosure also provides a display panel. The display panel may be an electronic paper display panel. The display panel may include an array substrate provided in the disclosed embodiments. FIG. 5A illustrates a top view of a display panel consistent with various disclosed embodiments of the present disclosure; and FIG. 5B illustrates a cross-sectional view of the display panel consistent with various disclosed embodiments of the present disclosure. Referring to FIGS. 5A and 5B, the array substrate may also include a plurality of gate lines 19. The plurality of gate lines 19 may extend along a first direction X and may be arranged along a second direction Y. The plurality of data signal lines 13 may extend along the second direction Y and may be arranged along the first direction X. The first direction X may intersect the second direction Y, and the gate lines 19 may be isolated from the data signal lines 13.

The plurality of gate lines 19 and the plurality of data signal lines 13 may intersect and define a plurality of pixel units 29. Each pixel unit 29 may include a pixel electrode 28. The gate line 19 and the data signal line 13 may be electrically connected to the pixel electrode 28 through the thin film transistor (TFT). In one embodiment, the array substrate may include a substrate base 21, a buffer layer 22 formed on the substrate base 21, and a semiconductor layer 23 formed on the buffer layer 22. The semiconductor layer 23 may include a first semiconductor region 231 and second semiconductor regions 232.

For example, the first semiconductor region 231 of the intrinsic polysilicon may be disposed at the central portion of the semiconductor layer 23, and the second semiconductor regions 232 of the doped polysilicon may be disposed on both sides of the first semiconductor region 231. The first semiconductor region 231 may serve as a channel of the TFT, and the second semiconductor regions 232 may serve as a source region and a drain region of the TFT, respectively.

A gate insulating layer 24 may be formed on the semiconductor layer 23. The gate insulating layer 24 may be made of inorganic insulating materials, such as silicon oxide and silicon nitride, etc. The gate line 19 and a gate electrode 25 may be formed on the gate insulating layer 24, and the gate electrode 25 may be connected to the gate line 19. A middle insulating layer 26 may be formed on the gate electrode 25 and the gate line 19. The middle insulating layer 26 may be may be made of inorganic insulating materials, such as silicon oxide and silicon nitride, etc. The middle insulating layer 26 and the gate insulating layer 24 may include semiconductor contact holes 261 exposing the second semiconductor regions 232 of the semiconductor layer 23.

A source electrode 271, a drain electrode 272, and the data signal line 13 may be formed on the middle insulating layer 26. The source electrode 271 and the drain electrode 272 may be separated from each other, and may be on the same layer as the data signal line 13. The pixel electrode 28 may be connected to the drain electrode 272. The source electrode 271 and the drain electrode 272 may be connected to the second semiconductor regions 232 through the semiconductor contact holes 261. The semiconductor layer 23, the gate insulating layer 24, the gate electrode 25, the middle insulating layer 26, the source electrode 271, and the drain electrode 272 may form the thin film transistor (TFT).

The display panel may also include an electrophoresis film 30, and a common electrode layer 31. The electrophoresis film 30 may be located between the common electrode 31 and the array substrate 10. The electrophoresis film 30 may cover a plurality of pixel units. The electrophoresis film 30 may be provided with an electrophoresis layer 301, and the electrophoresis layer 301 may include a plurality of electrophoresis particles. A cover layer 32 may be formed on the common electrode layer 31. The cover layer 32 may be made of glass, or plastic, etc.

When outputting a gate driving signal from the gate line 19, a row of thin film transistors electrically connecting to the gate line 19 may be turned on. The data signals on the data signal lines 13 may be transmitted to the pixel electrodes through the turned-on thin film transistors to charge the pixel electrodes. The electrophoresis particles in the electrophoresis layer 301 may move under the effect of the electric field generated by the voltage between the pixel electrodes and the common electrode. The reflection of the light may be controlled by the position where the electrophoresis particles move, thus the brightness of the display panel may be controlled and the display may be realized.

In one embodiment, the width of the display panel may be greater than or equal to 0.3 m along the first direction X. For a conventional display panel, when its width is greater than or equal to 0.3 m, a plurality of data driving ICs need to be provided to drive the display panel. In the present disclosure, only a small amount or even one data driving IC and one FPC may be needed. The terminals of the data driving IC may be repeatedly used to drive the normal operation of all the display areas of the display panel. Because the resolution of the electronic paper display panel is low, the effect of conventionally using a plurality of data driving IC can be achieved by repeatedly using one driving IC to drive each display area area-by-area. Therefore, the number of IC and FPC may be saved, and the cost may be saved.

Figure 6:
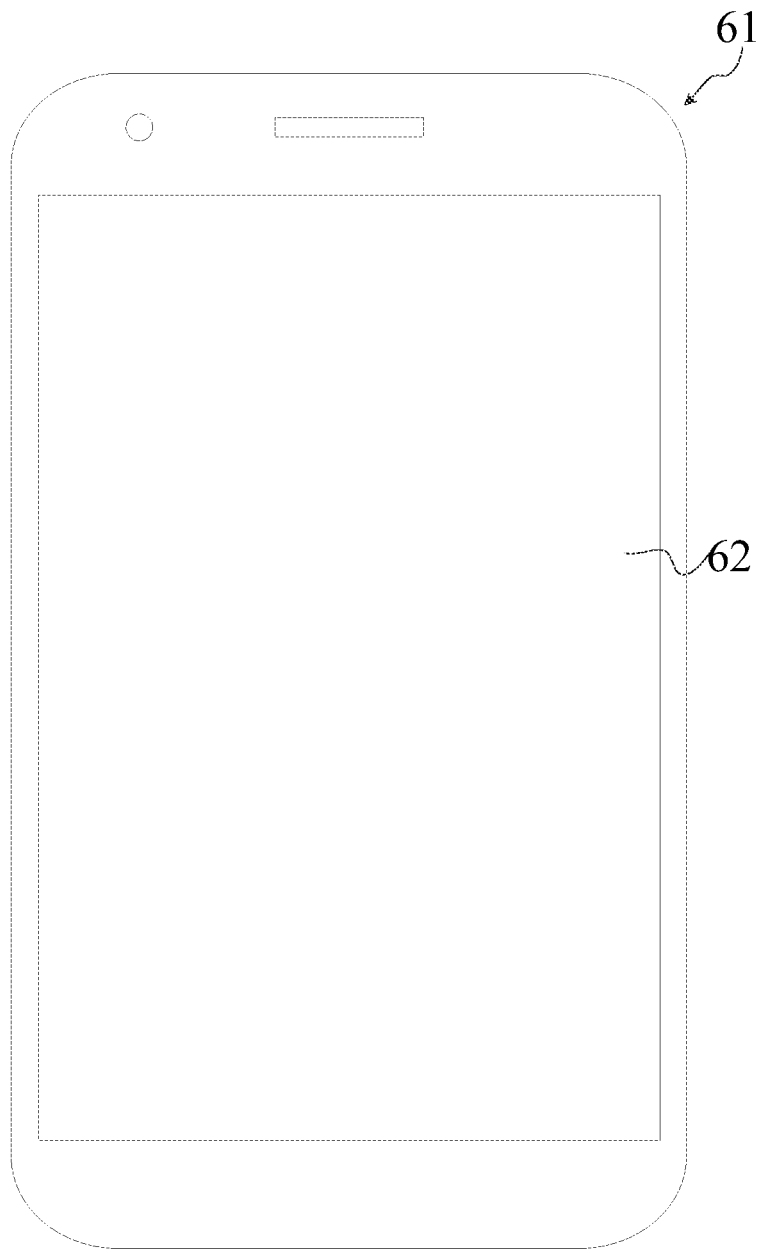
FIG. 6 illustrates a display device consistent with various disclosed embodiments of the present disclosure.

The present disclosure also provides a display device. FIG. 6 illustrates a display device consistent with disclosed embodiments. Referring to FIG. 6, the display device 61 may include a display panel 62 consistent with disclosed embodiments. The display panel 62 may be an electronic paper display panel.

Figure 7A:
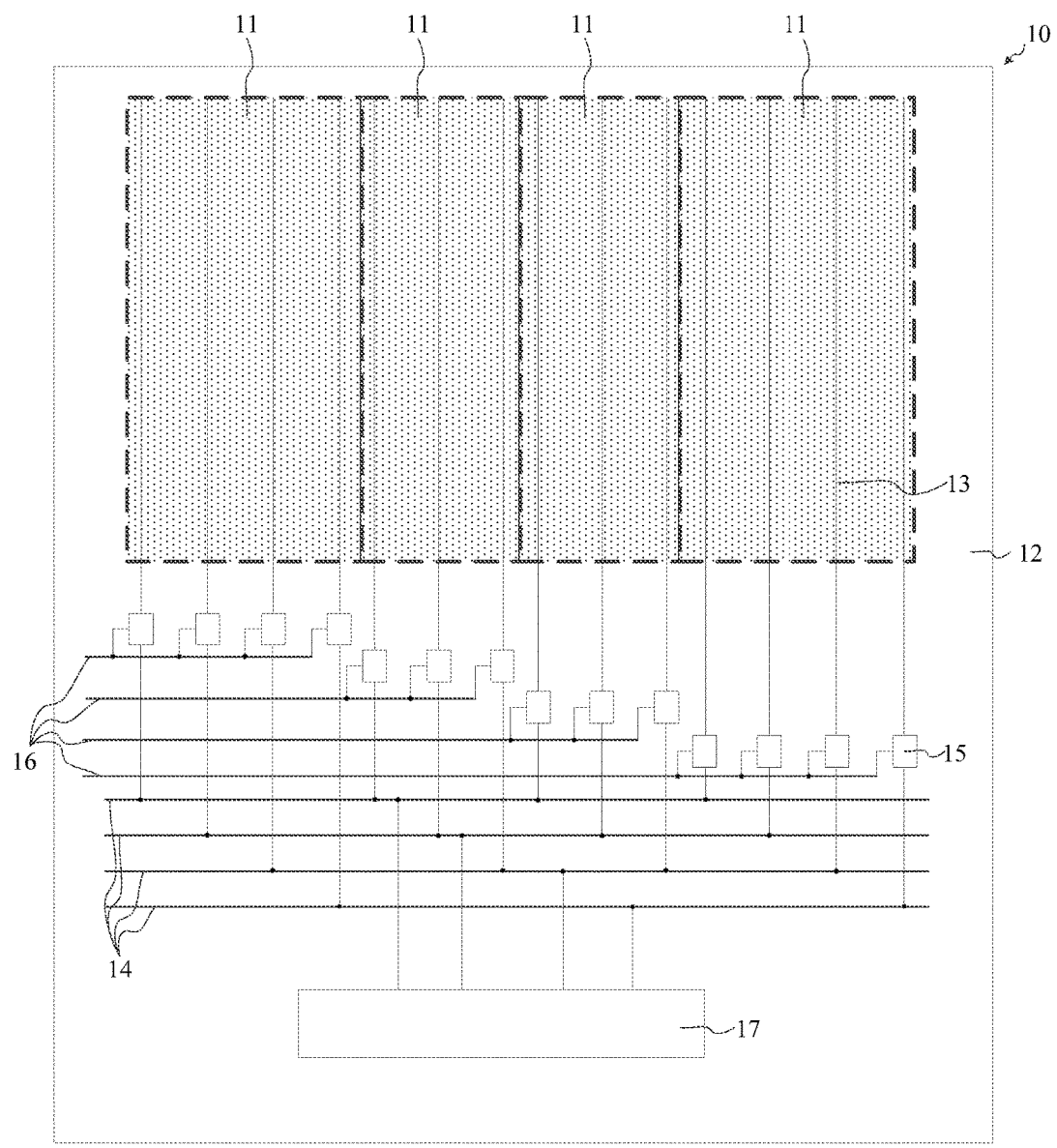
FIG. 7A illustrates an array substrate in an electronic paper display panel consistent with various disclosed embodiments of the present disclosure.

The present disclosure also provides a driving method of an electronic paper display panel. The driving method can be used to drive the display panel consistent with disclosed embodiments. The structure of the electronic paper display panel may be referred to FIGS. 5A and 5B. The electronic paper display panel may include an array substrate 10. The structure of the array substrate 10 may be referred to FIG. 7A. Referring to FIG. 7A, the array substrate may include at least two display areas 11 (e.g., four as shown) and a peripheral circuit area 12 surrounding the at least two display areas. Each display area 11 may be provided with a plurality of data signal lines 13. The peripheral circuit area 12 may be provided with a plurality of signal leads 14 and a plurality of switch modules 15. Each one data signal line 13 may be electrically connected to one signal lead 14 through one switch module 15. A first terminal of the switch module 15 may be electrically connected to the data signal line 13, and a second terminal of the switch module 15 may be electrically connected to the signal lead 14.

The number of the data signal lines 13 in each display area 11 may be less than or equal to the number of the signal leads 14. For the display area 11 where the number of the data signal lines 13 is less than the number of the signal leads 14, portions of the plurality of signal leads 14 may be one to one electrically connected to the data signal lines 13 in the display area 11. For the display area 11 where the number of the data signal lines 13 is equal to the number of the signal leads 14, the plurality of signal leads 14 may be one to one electrically connected to the data signal lines 13 in the display area 11.

The peripheral circuit area 12 may be provided with at least two control signal lines 16. All the control terminals of the switch modules 15 corresponding to the data signal lines 13 in single same display area 11 may be electrically connected to the same one control signal line 16. The control terminals of the switch modules 15 corresponding to the data signal lines 13 in different display areas 11 may be electrically connected to different control signal lines 16. In other words, the number of the control signal lines 16 may be equal to the number of the display areas. All the control terminals of the switch modules 15 electrically connecting to the data signal lines 13 in single one display area may be electrically connected to the same control signal line 16.

FIG. 7A illustrates four display areas 11 as an example, including a first display area, a second display area, a third display area, and a fourth display area from left to right. The number of the data signal lines 13 in both the first display area and the fourth display area may be equal to the number of the signal leads 14, which may be four. The four data signal lines 13 in the first display area may be one to one electrically connected to the four signal leads 14. The four data signal lines 13 in the fourth display area may be one to one electrically connected to the four signal leads 14. The number of the data signal lines 13 in both the second display area and the third display area may be less than the number of the signal leads 14. The three data signal lines 13 in the second display area may be one to one electrically connected to three of the four signal leads 14. The three data signal lines 13 in the third display area may be one to one electrically connected to three of the four signal leads 14. The number of display areas 11 on the array substrate 10 and the number of data signal lines 13 in each display area can be configured according to the specific array substrate.

Figure 7B:
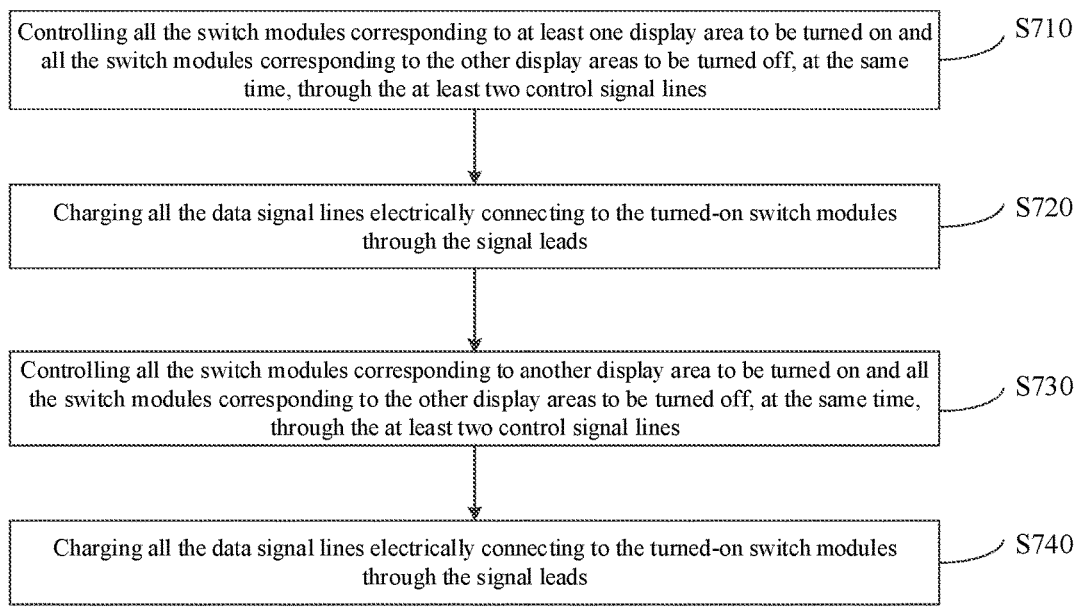
FIG. 7B illustrates an exemplary driving method of an electronic paper display panel consistent with various disclosed embodiments of the present disclosure.

FIG. 7B illustrates a driving method of the electronic paper display panel consistent with disclosed embodiments. The driving method may include the following steps.

S710: Controlling all the switch modules 15 corresponding to at least one display area 11 to be turned on and all the switch modules 15 corresponding to other display areas 11 to be turned off, at the same time, through the at least two control signal lines 16. The control signals may be outputted to the at least two control signal lines 16 and may be transmitted to the control terminals of the switch modules 15 through the control signal lines 16, to control the switch modules 15 electrically connecting to the same one control signal line 16 to be turned on or off. The switch modules corresponding to one display area 11 may be the switch modules electrically connecting to the data signal lines 13 in the display area.

S720: Charging all the data signal lines 13 electrically connecting to the turned-on switch modules 15 through the signal leads 14.

S730: Controlling all the switch modules 15 corresponding to another display area 11 to be turned on and all the switch modules 15 corresponding to the other display areas 11 to be turned off, at the same time, through the at least two control signal lines 16.

S740: Charging all the data signal lines 13 electrically connecting to the turned-on switch modules 15 through the signal leads 14.

Therefore, a separate control for each one display area using a same driving IC can be realized through the above-described driving method. For example, all the switch modules 15 corresponding to the first display area 101 may be controlled to be turned on, and, at the same time, all the switch modules 15 corresponding to the second display area 102, the third display area 103, and the fourth display area 104 may be controlled to be turned off. The data signal lines 13 in the first display area 101 may be charged through the signal leads 14. When a screen needs to be displayed on all the display areas, the data signal lines in the respective display areas can be charged on an area-by-area basis. When a screen needs to be displayed on all the display areas 11, the above steps may be repeated to charge the data signal lines 13 in the respective display areas 11 on an area-by-area basis. Then the screen can be displayed on all the display areas of the display panel.

Further, referring to FIG. 7A, in the electronic paper display panel consistent with disclosed embodiments, the peripheral circuit area 12 may be provided with a data driving circuit 17. The data signal output terminals of the data driving circuit 17 may be one to one electrically connected to the signal leads 14. The data driving circuit 17 may output the data signals to the signal leads 14.

The driving method of the electronic paper display panel consistent with disclosed embodiments may include controlling all the switch modules 15 corresponding to at least one display area 11 to be turned on and all the switch modules 15 corresponding to the other display areas 11 to be turned off, at the same time, through the at least two control signal lines 16.

For example, all the switch modules 15 corresponding to the first display area may be controlled to be turned on and all the switch modules 15 corresponding to the second display area, the third display area, and the fourth display area may be controlled to be turned off. Alternatively, all the switch modules 15 corresponding to the first display area and the fourth display area may be controlled to be turned on, and all the switch modules 15 corresponding to the second display area and the third display area may be controlled to be turned off. In this case, the first display area and the fourth display area may display the same contents.

When the switch modules 15 are turned on, the data driving circuit 17 may output the data signals to the signal leads 14. The signal leads 14 may charge all the data signal lines 13 electrically connecting to the turned-on switch modules 15.

Optionally, in the present disclosure, the control signal lines 16 may be electrically connected to the control signal output terminals of the data driving circuit 17. In the above-described driving method, the control signal output terminals of the data driving circuit 17 may output the control signals to the at least two control signal lines 16, to control the switch modules 15 electrically connecting to the control signal lines 16 to be turned on or off.

Figure 7C:
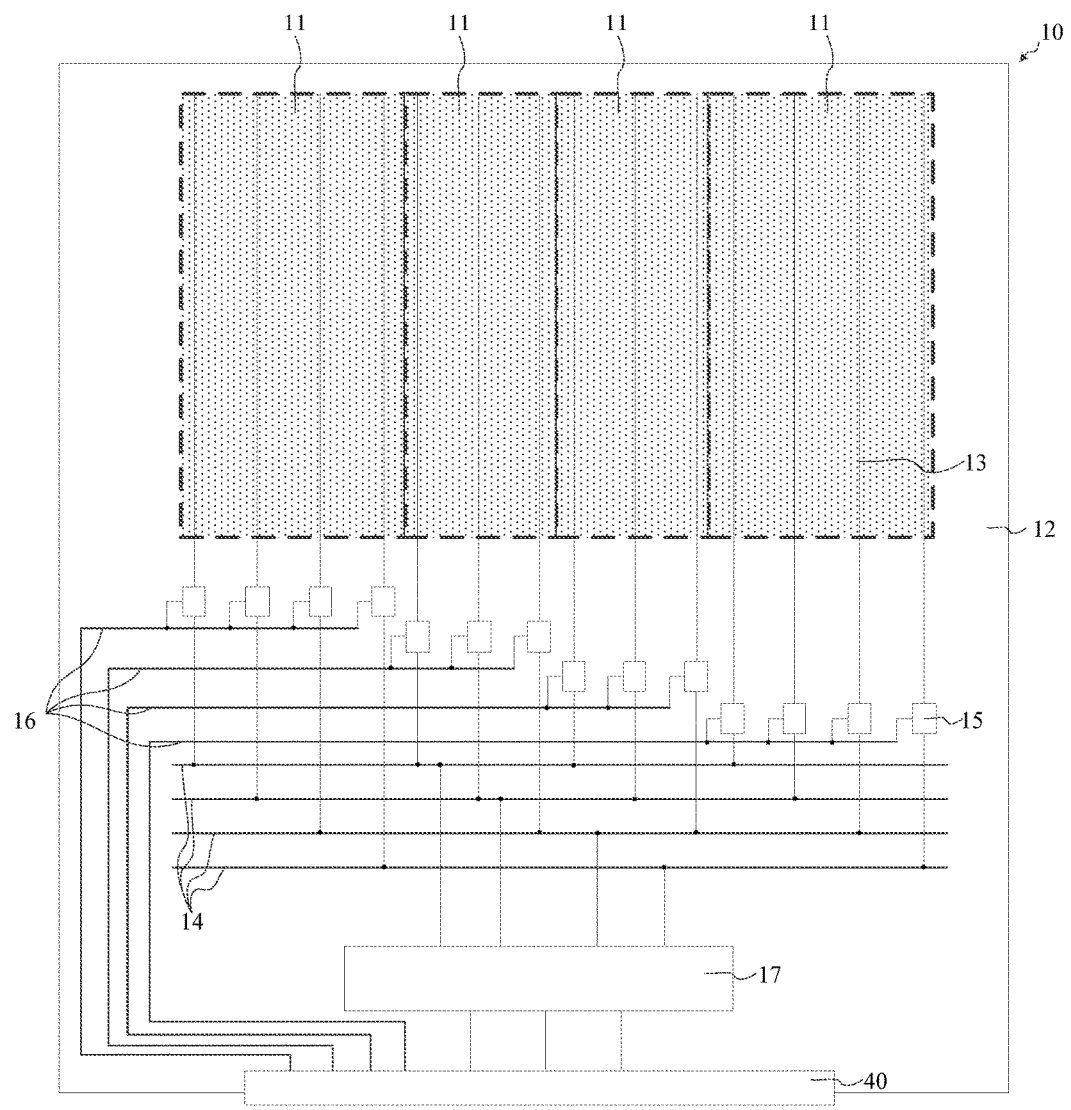
FIG. 7C illustrates an array substrate in another electronic paper display panel consistent with various disclosed embodiments of the present disclosure.

Optionally, in the present disclosure, referring to FIG. 7C, the data driving circuit 17 may be electrically connected to a flexible circuit board 40, and the control signal lines 16 may be electrically connected to the flexible circuit board 40. In the above-described driving method, the flexible circuit board 40 may output the control signals to the at least two control signal lines 16, to control the switch modules electrically connecting to the control signal lines 16 to be turned on or off.

Figure 7D:
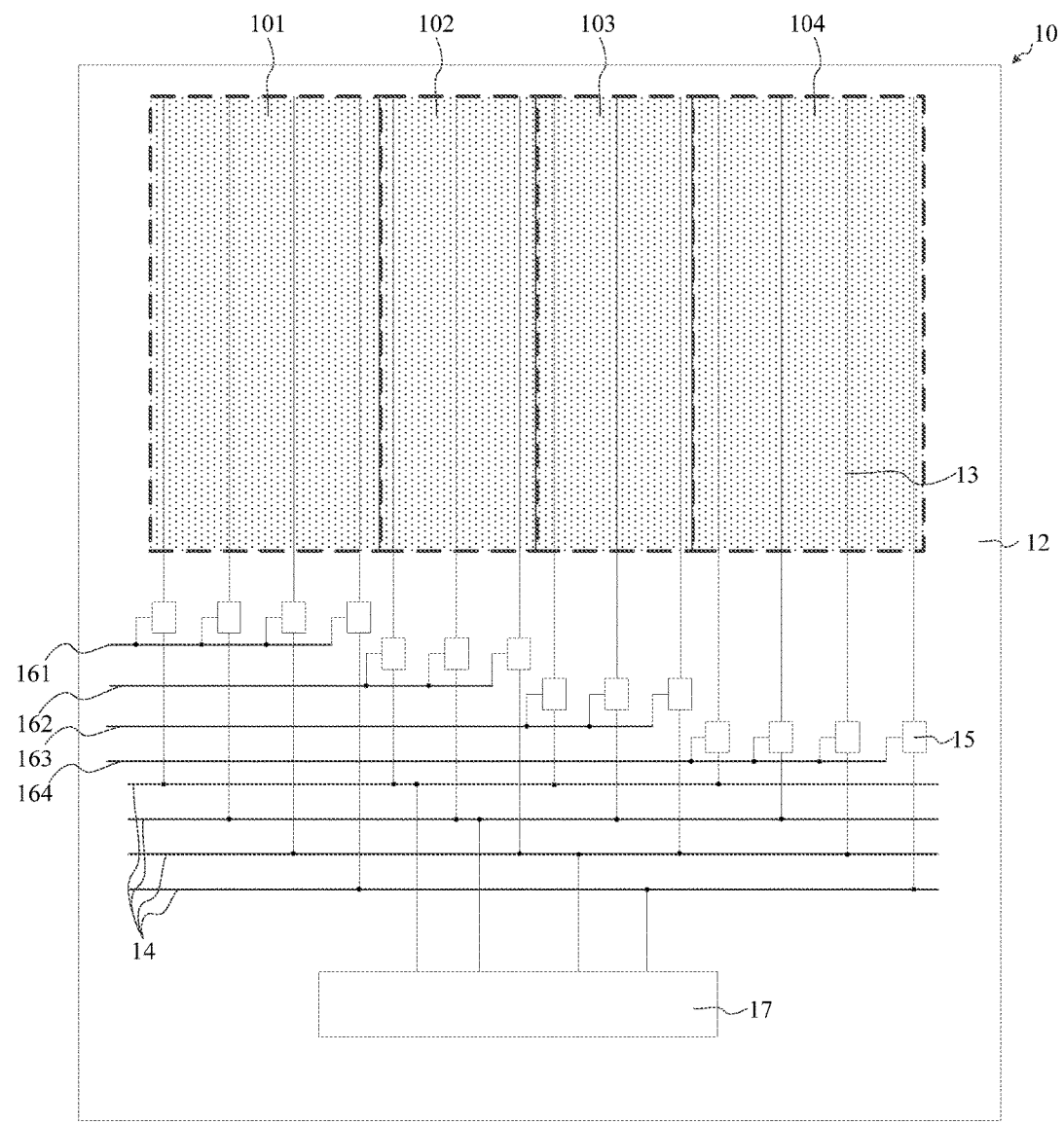
FIG. 7D illustrates an array substrate in another electronic paper display panel consistent with various disclosed embodiments of the present disclosure.

FIG. 7D illustrates an array substrate in another electronic paper display panel consistent with disclosed embodiments. Referring to FIG. 7D, on the basis of the array substrate illustrated in FIG. 7A, the array substrate may include four display areas: a first display area 101, a second display area 102, a third display area 103, and a fourth display area 104.

The peripheral circuit area 12 may be provided with four control signal lines: a first control signal line 161, a second control signal line 162, a third control signal line 163, and a fourth control signal line 164. The first control signal 161 may be electrically connected to the control terminals of the switch modules 15 corresponding to all the data signal lines 13 in the first display area 101. The second control signal 162 may be electrically connected to the control terminals of the switch modules 15 corresponding to all the data signal lines 13 in the second display area 102. The third control signal 163 may be electrically connected to the control terminals of the switch modules 15 corresponding to all the data signal lines 13 in the third display area 103. The fourth control signal 164 may be electrically connected to the control terminals of the switch modules 15 corresponding to all the data signal lines 13 in the fourth display area 104.

The driving method of the electronic paper display panel consistent with disclosed embodiments may include the following. In a certain period of time, the switch modules 15 corresponding to all the data signal lines 13 in the first display area 101 may be controlled to be turned on through the first control signal line 161. At the same time, the switch modules 15 corresponding to all the data signal lines 13 in the second display area 102, the third display area 103, and the fourth display area 104 may be controlled to be turned off through the second control signal line 162, the third control signal line 163, and the fourth control signal line 164, respectively. The data signal lines 13 in the first display area 101 may be charged through the signal leads 14.

In another certain period of time, the switch modules 15 corresponding to all the data signal lines 13 in the second display area 102 may be controlled to be turned on through the second control signal line 162. At the same time, the switch modules 15 corresponding to all the data signal lines 13 in the first display area 101, the third display area 103, and the fourth display area 104 may be controlled to be turned off through the first control signal line 161, the third control signal line 163, and the fourth control signal line 164, respectively. The data signal lines 13 in the second display area 102 may be charged through the signal leads 14.

In another certain period of time, the switch modules 15 corresponding to all the data signal lines 13 in the third display area 103 may be controlled to be turned on through the third control signal line 163. At the same time, the switch modules 15 corresponding to all the data signal lines 13 in the first display area 101, the second display area 102, and the fourth display area 104 may be controlled to be turned off through the first control signal line 161, the second control signal line 162, and the fourth control signal line 164, respectively. The data signal lines 13 in the third display area 103 may be charged through the signal leads 14.

In another certain period of time, the switch modules 15 corresponding to all the data signal lines 13 in the fourth display area 104 may be controlled to be turned on through the fourth control signal line 164. At the same time, the switch modules 15 corresponding to all the data signal lines 13 in the first display area 101, the second display area 102, and the third display area 103 may be controlled to be turned off through the first control signal line 161, the second control signal line 162, and the third control signal line 163, respectively. The data signal lines 13 in the fourth display area 104 may be charged through the signal leads 14.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An array substrate, comprising:
at least two display areas;
a peripheral circuit area surrounding the at least two display areas;
a plurality of data signal lines provided in each display area;
a plurality of signal leads provided in the peripheral circuit area;
a plurality of switch modules provided in the peripheral circuit area, wherein each data signal line of the plurality of data signal lines is electrically connected to one signal lead of the plurality of signal leads through one switch module of the plurality of switch modules, a first terminal of the switch module is electrically connected to the data signal line, and a second terminal of the switch module is electrically connected to the signal lead; and
at least two control signal lines provided in the peripheral circuit area, wherein:
in a single same display area, all control terminals of the switch modules corresponding to all the data signal lines in the single same display area are electrically connected to a same control signal line,
in different display areas, the control terminals of the switch modules corresponding to the data signal lines in the different display areas are electrically connected to different control signal lines, and
a number of the plurality of data signal lines in each display area is less than or equal to a number of the plurality of signal leads, wherein:
for a display area of the at least two display areas where the number of the data signal lines is less than the number of the signal leads, portions of the plurality of signal leads are one to one electrically connected to the data signal lines in the display area; and
for a display area of the at least two display areas where the number of the data signal lines is equal to the number of the signal leads, the plurality of signal leads are one to one electrically connected to the data signal lines in the display area.

2. The array substrate according to claim 1, wherein:
the number of the data signal lines is the same in each display area; and
each one signal lead is electrically connected to one data signal line in each display area.

3. The array substrate according to claim 1, wherein:
the array substrate includes three or four display areas.

4. The array substrate according to claim 1, wherein:
the switch module includes a transistor;
a first terminal of the transistor is electrically connected to the first terminal of the switch module;
a second terminal of the transistor is electrically connected to the second terminal of the switch module; and
a gate electrode of the transistor is electrically connected to the control terminal of the switch module.

5. The array substrate according to claim 1, wherein:
the peripheral circuit area is provided with a data driving circuit; and data signal output terminals of the data driving circuit are one to one electrically connected to the signal leads.

6. The array substrate according to claim 5, wherein:
the at least two control signal lines are one to one electrically connected to control signal output terminals of the data driving circuit.

7. The array substrate according to claim 5, wherein:
the data driving circuit is electrically connected to a flexible circuit board; and
the at least two control signal lines are electrically connected to the flexible circuit board.

8. The array substrate according to claim 1, further including:
at least one boundary area between the adjacent display areas, wherein the at least one boundary area is not used for display.

9. The array substrate according to claim 8, wherein:
the array substrate includes a plurality of boundary areas between any two adjacent display areas.

10. An electronic paper display panel, comprising:
an array substrate, including:
at least two display areas;
a peripheral circuit area surrounding the at least two display areas;
a plurality of data signal lines provided in each display area;
a plurality of signal leads provided in the peripheral circuit area;
a plurality of switch modules provided in the peripheral circuit area, wherein each data signal line of the plurality of data signal lines is electrically connected to one signal lead of the plurality of signal leads through one switch module of the plurality of switch modules, a first terminal of the switch module is electrically connected to the data signal line, and a second terminal of the switch module is electrically connected to the signal lead; and
at least two control signal lines provided in the peripheral circuit area, wherein:
in a single same display area, all control terminals of the switch modules corresponding to all the data signal lines in the single same display area are electrically connected to a same control signal line,
in different display areas, the control terminals of the switch modules corresponding to the data signal lines in the different display areas are electrically connected to different control signal lines, and
a number of the plurality of data signal lines in each display area is less than or equal to a number of the plurality of signal leads, wherein:
for a display area of the at least two display areas where the number of the data signal lines is less than the number of the signal leads, portions of the plurality of signal leads are one to one electrically connected to the data signal lines in the display area; and
for a display area of the at least two display areas where the number of the data signal lines is equal to the number of the signal leads, the plurality of signal leads are one to one electrically connected to the data signal lines in the display area.

11. The electronic paper display panel according to claim 10, wherein:
the array substrate includes a plurality of gate lines;
the plurality of gate lines extends along a first direction and is arranged along a second direction;
the plurality of data signal lines extends along the second direction and is arranged along the first direction;
the first direction intersects the second direction;
the plurality of gate lines is isolated from the plurality of data signal lines;
the plurality of gate lines and the plurality of data signal lines intersect and define a plurality of pixel units, wherein each pixel unit includes a pixel electrode;
the display panel includes an electrophoresis film and a common electrode layer, wherein the electrophoresis film is located between the common electrode layer and the array substrate;
the electrophoresis film covers the plurality of pixel units;
the electrophoresis film is provided with an electrophoresis layer; and
the electrophoresis layer includes a plurality of electrophoresis particles.

12. The electronic paper display panel according to claim 11, wherein:
a width of the display panel is greater than or equal to 0.3 m along the first direction.

13. A driving method of an electronic paper display panel, wherein:
the electronic paper display panel includes an array substrate, wherein the array substrate includes:
at least two display areas,
a peripheral circuit area surrounding the at least two display areas,
a plurality of data signal lines provided in each display area,
a plurality of signal leads provided in the peripheral circuit area, wherein a number of the plurality of data signal lines in each display area is less than or equal to a number of the plurality of signal leads, wherein:
for a display area of the at least two display areas where the number of the data signal lines is less than the number of the signal leads, portions of the plurality of signal leads are one to one electrically connected to the data signal lines in the display area; and for a display area of the at least two display areas where the number of the data signal lines is equal to the number of the signal leads, the plurality of signal leads are one to one electrically connected to the data signal lines in the display area,
a plurality of switch modules provided in the peripheral circuit area, wherein each one data signal line of the plurality of data signal lines is electrically connected to one signal lead of the plurality of signal leads through one switch module of the plurality of switch modules, a first terminal of the switch module is electrically connected to the data signal line, and a second terminal of the switch module is electrically connected to the signal lead, and
at least two control signal lines provided in the peripheral circuit area, wherein in a single same display area, all control terminals of the switch modules corresponding to all the data signal lines in the single same display area are electrically connected to a same control signal line, and in different display areas, the control terminals of the switch modules corresponding to the data signal lines in the different display areas are electrically connected to different control signal lines; and
the driving method includes:
controlling all the switch modules corresponding to at least one display area to be turned on and all the switch modules corresponding to the other display areas to be turned off, at the same time, through the at least two control signal lines, charging all the data signal lines electrically connected to the turned-on switch modules through the signal leads, controlling all the switch modules corresponding to another display area to be turned on and all the switch modules corresponding to the other display areas to be turned off, at the same time, through the at least two control signal lines, and charging all the data signal lines electrically connected to the turned-on switch modules through the signal leads.

14. The method according to claim 13, wherein:

the peripheral circuit area is provided with a data driving circuit;

data signal output terminals of the data driving circuit are one to one electrically connected to the plurality of signal leads; and the data driving circuit outputs data signals to the plurality of signal leads to charge the data signal lines electrically connected to all the turned-on switch modules when the switch modules are turned on.

15. The method according to claim 14, wherein:

the at least two control signal lines are electrically connected to control signal output terminals of the data driving circuit; and the data driving circuit outputs control signals to the at least two control signal lines to control the switch modules electrically connected to the at least two control signal lines to be turned on or off.

16. The method according to claim 14, wherein:

the data driving circuit is electrically connected to a flexible circuit board;

the at least two control signal lines are electrically connected to the flexible circuit board; and the flexible circuit board outputs control signals to the at least two control signal lines to control the switch modules electrically connected to the at least two control signal lines to be turned on or off.

17. The method according to claim 13, wherein:

steps of the driving method are repeated until all the plurality of data signal lines in all of the at least two display areas are charged through the plurality of signal leads.

18. The method according to claim 13, wherein:

the array substrate includes four display areas: a first display area, a second display area, a third display area, and a fourth display area;

the peripheral circuit area is provided with four control signal lines: a first control signal line, a second control signal line, a third control signal line, and a fourth control signal line;

the first control signal line is electrically connected to control terminals of the switch modules corresponding to all the data signal lines in the first display area;

the second control signal line is electrically connected to control terminals of the switch modules corresponding to all the data signal lines in the second display area;

the third control signal line is electrically connected to control terminals of the switch modules corresponding to all the data signal lines in the third display area;

the fourth control signal line is electrically connected to control terminals of the switch modules corresponding to all the data signal lines in the fourth display area; and the switch modules corresponding to all the data signal lines in the first display area are controlled to be turned on through the first control signal line, and, at the same time, the switch modules corresponding to all the data signal lines in the second display area, the third display area, and the fourth display area are controlled to be turned off through the second control signal line, the third control signal line, and the fourth control signal line, respectively, wherein the data signal lines in the first display area are charged through the signal leads; or the switch modules corresponding to all the data signal lines in the second display area are controlled to be turned on through the second control signal line, and, at the same time, the switch modules corresponding to all the data signal lines in the first display area, the third display area, and the fourth display area are controlled to be turned off through the first control signal line, the third control signal line, and the fourth control signal line, respectively, wherein the data signal lines in the second display area are charged through the signal leads; or the switch modules corresponding to all the data signal lines in the third display area are controlled to be turned on through the third control signal line, and, at the same time, the switch modules corresponding to all the data signal lines in the first display area, the second display area, and the fourth display area are controlled to be turned off through the first control signal line, the second control signal line, and the fourth control signal line, respectively, wherein the data signal lines in the third display area are charged through the signal leads; or the switch modules corresponding to all the data signal lines in the fourth display area are controlled to be turned on through the fourth control signal line, and, at the same time, the switch modules corresponding to all the data signal lines in the first display area, the second display area, and the third display area are controlled to be turned off through the first control signal line, the second control signal line, and the third control signal line, respectively, wherein the data signal lines in the fourth display area are charged through the signal leads.

\* \* \* \* \*